(12) United States Patent  
Miwa et al.

(10) Patent No.: US 6,985,038 B2  
(45) Date of Patent: Jan. 10, 2006

(54) OPERATIONAL AMPLIFIER GENERATING DESIRED FEEDBACK REFERENCE VOLTAGE ALLOWING IMPROVED OUTPUT CHARACTERISTIC

(75) Inventors: Toshitsugu Miwa, Hyogo (JP); Takahiro Miki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/830,450

(22) Filed: Apr. 23, 2004

(65) Prior Publication Data

US 2004/0239426 A1 Dec. 2, 2004

(30) Foreign Application Priority Data

Apr. 25, 2003 (JP) .............................. 2003-122152

(51) Int. Cl.  
*H03F 3/45* (2006.01)

(52) U.S. Cl. ...................... 330/258; 330/253; 330/260

(58) Field of Classification Search ................ 330/258, 330/253, 260, 252, 259, 261

See application file for complete search history.

(56) References Cited

U.S. PATENT DOCUMENTS

| 5,729,178 A | * | 3/1998 | Park et al. ................... 330/258 |
| 5,847,601 A | * | 12/1998 | Wang ............................. 330/9 |
| 5,955,922 A | * | 9/1999 | Nicollini et al. ............. 330/258 |
| 6,052,025 A | * | 4/2000 | Chang et al. ............. 330/253 |
| 6,677,822 B2 | * | 1/2004 | Hasegawa ................... 330/258 |

FOREIGN PATENT DOCUMENTS

JP 11-298271 10/1999

* cited by examiner

*Primary Examiner*—John B Nguyen  
(74) *Attorney, Agent, or Firm*—McDermott Will & Emery LLP

(57) ABSTRACT

A voltage setting circuit includes a voltage setting region setting a voltage level corresponding to a maximum value in amplitude of a signal output from an OTA circuit, a voltage setting region setting a voltage level corresponding to a minimum value in amplitude of the signal, and an intermediate voltage setting region setting a voltage intermediate between the voltages set by the above two regions. This intermediate voltage is input to a common mode feedback circuit and in accordance with the intermediate voltage the common mode feedback circuit generates a common mode voltage fed back to the OTA circuit.

9 Claims, 10 Drawing Sheets

OPERATIONAL AMPLIFIER GENERATING DESIRED FEEDBACK REFERENCE VOLTAGE ALLOWING IMPROVED OUTPUT CHARACTERISTIC

BACKGROUND OF THE INVENTION

1. Field of the Invention

The present invention relates generally to operational amplifiers and particularly to differential transconductance amplifiers that can monolithically integrated by CMOS technology.

2. Description of the Background Art

In recent years, LSIs and the like used to process an RF band signal in mobile communications employ a so-called Gm-C filter serving as a bandpass filter. This Gm-C filter is provided as a circuit having as its base an operational transconductance amplifier (hereinafter also referred to as an OTA circuit) performing voltage-current conversion. While this OTA circuit belongs in a broad sense to an operational amplifier, it also has a high output impedance for a closed loop, and is used for a variety of circuits for general purpose. Generally, this OTA circuit is arranged together with a so-called common mode feedback circuit and in response to the OTA circuit's differential output signal the common mode feedback circuit generates a common mode feedback control signal (hereinafter also simply referred to as a feedback control signal) and feeds the signal back to the OTA circuit. In response to feedback control signal fed back the OTA circuit has an output characteristic determined.

Japanese Patent Laying-Open No. 11-298271 discloses an amplifier capable of adjusting a feedback control signal.

The feedback control signal generated by the common mode feedback circuit is set to a value depending on a prescribed bias voltage, or a common mode feedback reference voltage (hereinafter also simply referred to as a feedback reference voltage).

Typically, this feedback reference voltage is set to have a prescribed designed value and provided as an operation reference voltage for a signal output from the OTA circuit.

However, as for example the OTA circuit's process varies, the OTA circuit has a constituent transistor varying in threshold voltage, β value and the like or in pinch-off voltage. Accordingly to allow the OTA circuit to achieve an optimal output characteristic it is necessary to adjust a feedback reference voltage as desired that is input. In the aforementioned reference, it is possible to simply adjust a voltage level. It is difficult, however, to consider the OTA circuit's process variation or the like to optimally adjust a voltage level.

SUMMARY OF THE INVENTION

The present invention contemplates an operational amplifier capable of generating a desired feedback reference voltage with high precision to allow an OTA circuit to achieve suitable output characteristic.

The present operational amplifier includes an operational amplification circuit and a feedback circuit. The operational amplification circuit receives two input signals and amplifies a difference in voltage between the two input signals to output two signals, respectively. The feedback circuit receives the two signals output from the differential amplification circuit to control an amount of an electric current flowing through the differential amplification circuit. The feedback circuit includes a voltage setting circuit and a common mode feedback circuit. The voltage setting circuit sets a feedback reference voltage serving as a reference in amplitude for the two signals output. The common mode feedback circuit receives the feedback reference voltage set by the voltage setting circuit and the two signals output and is driven thereby to generate a feedback control signal controlling the amount of the electric current flowing through the differential amplification circuit. The voltage setting circuit has a pseudo current path portion, first and second voltage setting portions and an intermediate voltage setting portion. The pseudo current path portion forms a current path similar to that passing through the differential amplification circuit. The first voltage setting portion sets as based on a current flowing through the pseudo current path portion a voltage level of a first internal node to be a first voltage corresponding to a voltage level allowing at least one of the two signals output to be maximized in amplitude. The second voltage setting portion sets as based on the current flowing through the pseudo current path portion a voltage level of a second internal node to be a second voltage corresponding to a voltage level allowing at least one of the two signals output to be minimized in amplitude. The intermediate voltage setting portion sets for a voltage output node an average value of the first and second voltages set in the first and second voltage setting portions for the first and second internal nodes.

The present invention, as has been described above, allows a voltage setting circuit to include: a first voltage setting portion setting as based on a current flowing through a pseudo current path portion a voltage level of a first internal node to be a first voltage corresponding to a voltage level allowing at least one of two output signals to be maximized in amplitude, a second voltage setting portion setting as based on the current flowing through the pseudo current path portion a voltage level of a second internal node to be a second voltage corresponding to a voltage level allowing at least one of the two output signals to be minimized in amplitude, and an intermediate voltage setting portion setting an average value of the first and second voltages for a voltage output node. Accordingly, a voltage corresponding to a center of an amplitude of a differential amplification circuit, or an optimal reference voltage can be set. A maximum operable range can be ensured and suitable output characteristic can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
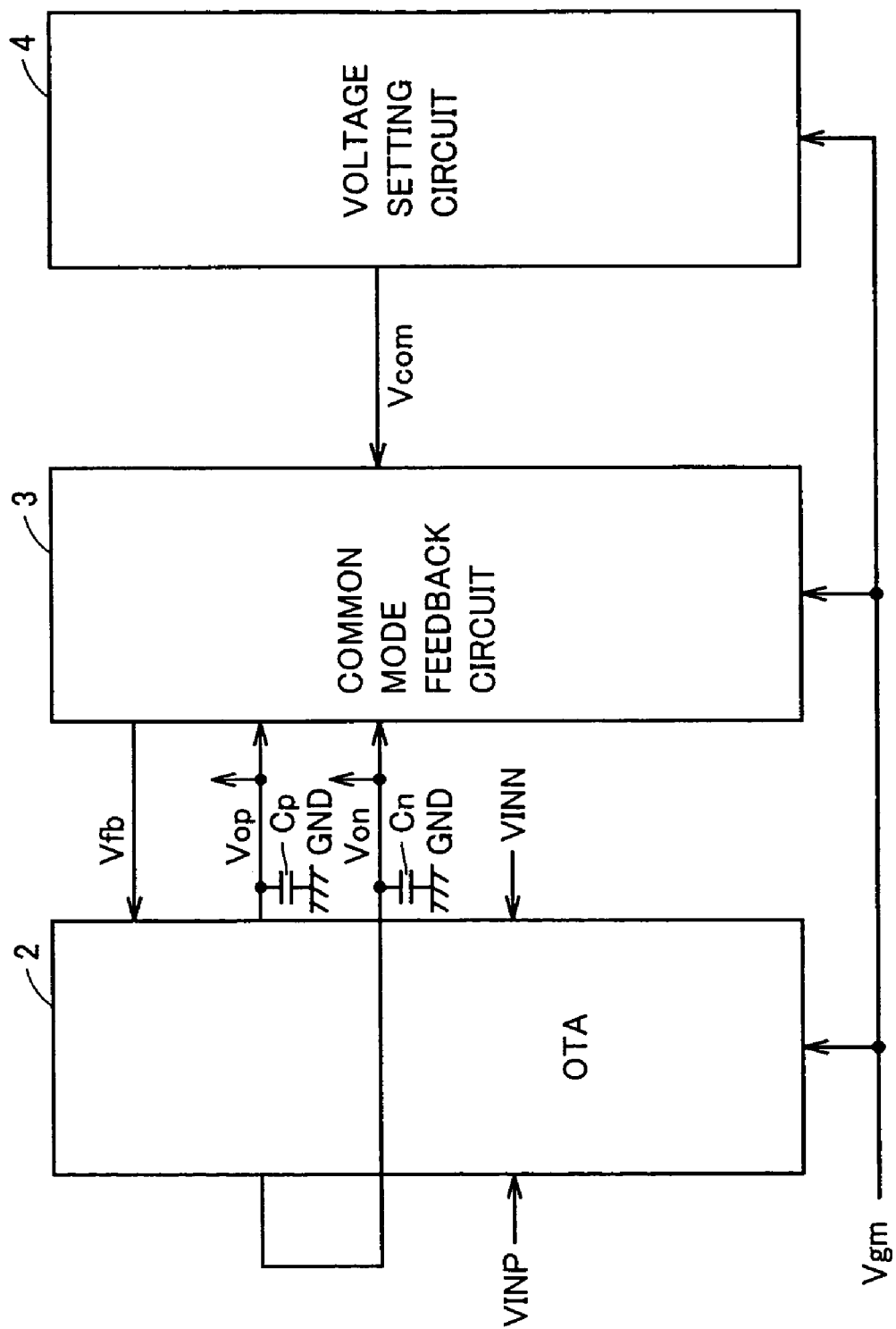
FIG. 1 is a schematic block diagram of an operational amplifier in accordance with the present invention in a first embodiment.

The present invention in embodiments will now be described hereinafter with reference to the drawings more specifically. In the figures, like components are denoted by like reference characters and their descriptions will not be repeated.

First Embodiment

With reference to FIG. 1, the present invention in a first embodiment provides an operational amplifier 1 including an OTA circuit 2, a common mode feedback circuit 3, a voltage setting circuit 4, and capacitors Cp and Cn.

OTA circuit 2 receives differential input signals VINP and VINN to amplify their difference in voltage to generate differential output signals Vop and Von.

Capacitors Cp and Cn are connected between an output line of OTA circuit 2 and a ground voltage GND. More specifically, capacitor Cp is connected between a line outputting differential output signal Vop and ground voltage GND. Capacitor Cn is connected between a line outputting differential output signal Von and ground voltage GND. Differential output signals Vop and Von correspond to voltages of integrals of currents flowing from OTA circuit 2 into capacitors Cp and Cn, respectively.

Common mode feedback circuit 3 feeds back a feedback control signal Vfb to OTA circuit 2, as based on differential output signals Vop and Von received from OTA circuit 2 and a feedback reference voltage Vcom provided from voltage setting circuit 4.

Voltage setting circuit 4 generates feedback reference voltage Vcom, as prescribed, and outputs it to common mode feedback circuit 3. The prescribed feedback reference voltage Vcom is set at an intermediate voltage serving as a reference for the level in amplitude of differential output signals Vop and Von output from OTA circuit 2, as will be described hereinafter.

Furthermore, OTA circuit 2, common mode feedback circuit 3 and voltage setting circuit 4 receive an externally input control signal, or a so-called transconductance value control signal Vgm (hereinafter also simply referred to as control signal Vgm).

Figure 2:
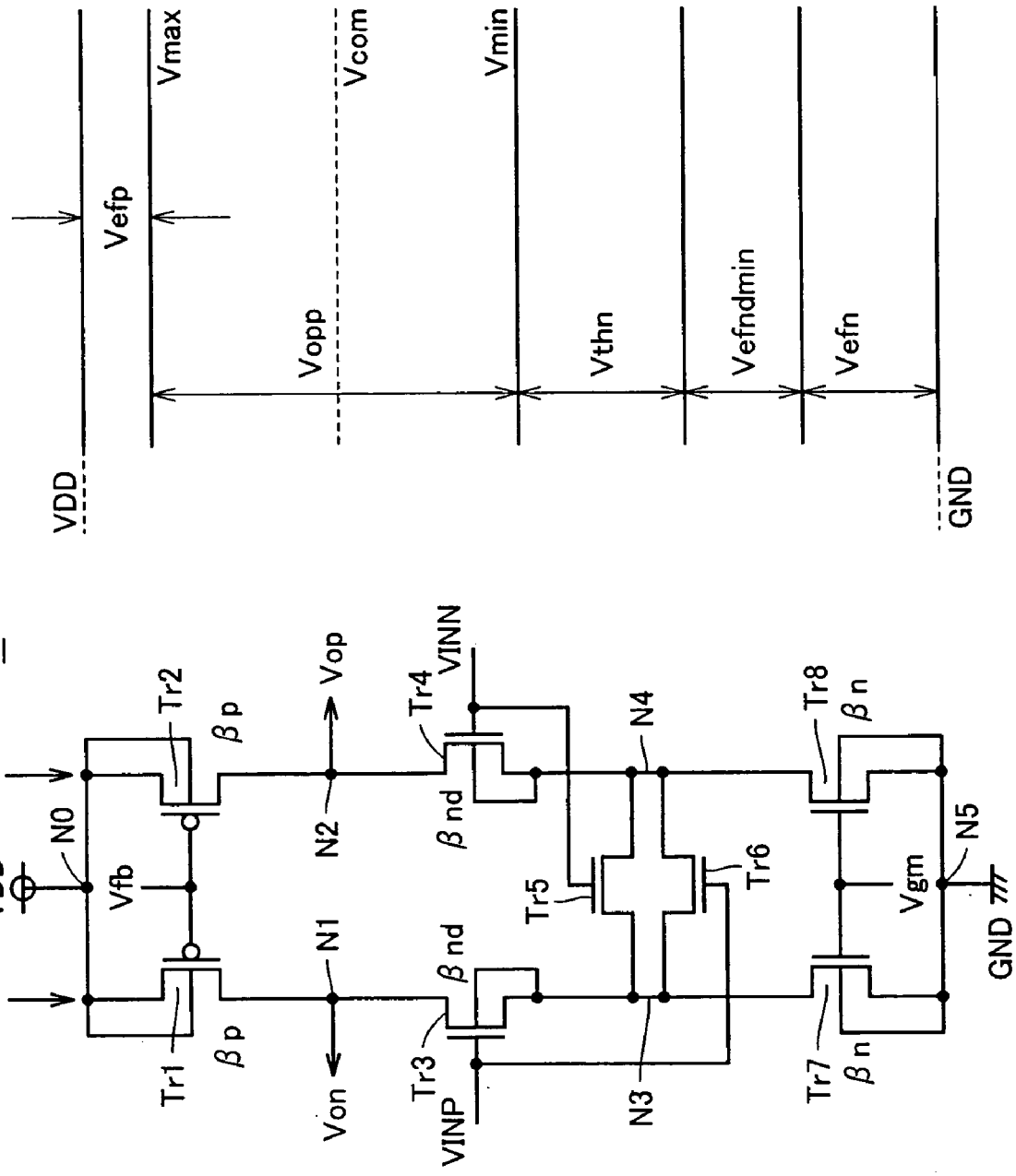
FIG. 2 shows a configuration of an OTA circuit in the first embodiment.

With reference to FIG. 2, in the first embodiment OTA circuit 2 includes transistors Tr1–Tr8.

Transistor Tr1 is arranged between a node N0 receiving a power supply voltage VDD and an output node N1 and has its gate receiving feedback control signal Vfb from common mode feedback circuit 3. Transistor Tr2 is arranged between node N0 and an output node N2 and has its gate receiving feedback-control signal Vfb. Transistor Tr3 is arranged between output node N1 and a node N3 and has its gate receiving differential input signal VINP. Transistor Tr4 is arranged between output node N2 and a node N4 and has its gate receiving differential input signal VINN. Transistor Tr5 is arranged between nodes N3 and N4 and has its gate receiving differential input signal VINN. Transistor Tr6 is arranged between nodes N3 and N4 and has its gate receiving differential input signal VINP. Transistor Tr7 is arranged between node N3 and a node N5 receiving ground voltage GND and has its gate receiving control signal Vgm. Transistor Tr8 is arranged between nodes N4 and N5 has its gate receiving control signal Vgm.

Herein, transistors Tr1 and Tr2 are p channel MOS transistors and transistors Tr3–Tr8 are n channel MOS transistors for the sake of illustration. Furthermore in this example transistors Tr1 and Tr2 both provide a so-called β value of βp for the sake of illustration. A β value is a constant determined by a product of transistor gate width/gate length (W/L) and so-called process transconductance value. Furthermore, transistors Tr3 and Tr4 both provide a β value of βnd for the sake of illustration. Transistors Tr7 and Tr8 provide a β value of βn for the sake of illustration. Note that in the first embodiment OTA circuit 2 is configured of transistors Trs all having a backgate electrically coupled with to a source for the sake of illustration.

OTA circuit 2 operates, as will be described hereinafter.

OTA circuit 2 receives differential input signals VINP and VINN and transistors Tr5 and Tr6 responsively turn on/off Accordingly, transistors Tr5 and Tr6 have their combined resistance value varying and the signals' difference is amplified to generate differential output signals Von and Vop on output nodes N1 and N2. More specifically, if differential input signals VINP and VINN input are a signal with a small amplitude, transistors Tr5 and Tr6 act as a resistor operating in a linear range and its parallel resistance value will serve as a combined resistance value. If differential input signals VINP and VINN are signals with a large amplitude then of transistors Tr5 and Tr6 the transistor with the voltage across the gate and that across the source having a reduced difference in potential enters a high impedance state, and on-resistance alone of the transistor with increased gate-source voltage will serve as a combined resistance value. Herein, transistors Tr3 and Tr4 receive complementary differential input signals VINP and VINN, and the OTA circuit differentially operates. Thus on output nodes N1 and N2 symmetrical source and sink currents are generated for each half period of differential input signal input. The source and sink currents are adjusted by a conductance value based on the transistors Tr5 and Tr6 combined resistance value. Differential output signals Vop and Von are generated by a voltage of an integral of capacitors Cp and Cn based on the source and sink currents.

An operable range Vopp of OTA circuit 2 generating differential output signals Vop and Von at output nodes N1 and N2 will now be described.

For the sake of illustration, Vefp represents a pinch-off voltage of transistors Tr1 and Tr2, Vefnd represents that of transistors Tr3 and Tr4, and Vefn represents that of transistors Tr7 and Tr8. Furthermore, Vthn represents a threshold voltage of transistors Tr3 and Tr4.

Then, when a maximum voltage level of a signal appearing in OTA circuit 2 on output nodes N1 and N2 is considered, the following expression can be derived:

$$V\text{com}+(V\text{opp}/2) \leq VDD - V\text{efp} = V\text{max} \quad (1).$$

Feedback reference voltage Vcom is an intermediate voltage serving as a reference in amplitude for a differential output signal, as has been described previously. Thus a maximum operating voltage value Vmax in range Vopp can be derived.

Furthermore, when the transistors Tr3 and Tr4 source and drain voltages are considered, a minimum operating voltage value Vmin in range Vopp of output nodes N1 and N2 can be derived by the following expression:

$$Vcom-(Vopp/2) \geq Vthn+Vefnd\ min+Vefn=V\ min \qquad (2).$$

Herein pinch-off voltage Vefndmin indicates a minimum value of pinch-off voltage of transistors Tr3 and Tr4.

This relationship is diagrammatically represented, as indicated in FIG. 2 on the right hand of OTA circuit 2.

Maximum and minimum operating voltage values Vmax and Vmin can be used to set feedback reference voltage Vcom intermediate therebetween to ensure maximum range Vopp.

Figure 3:
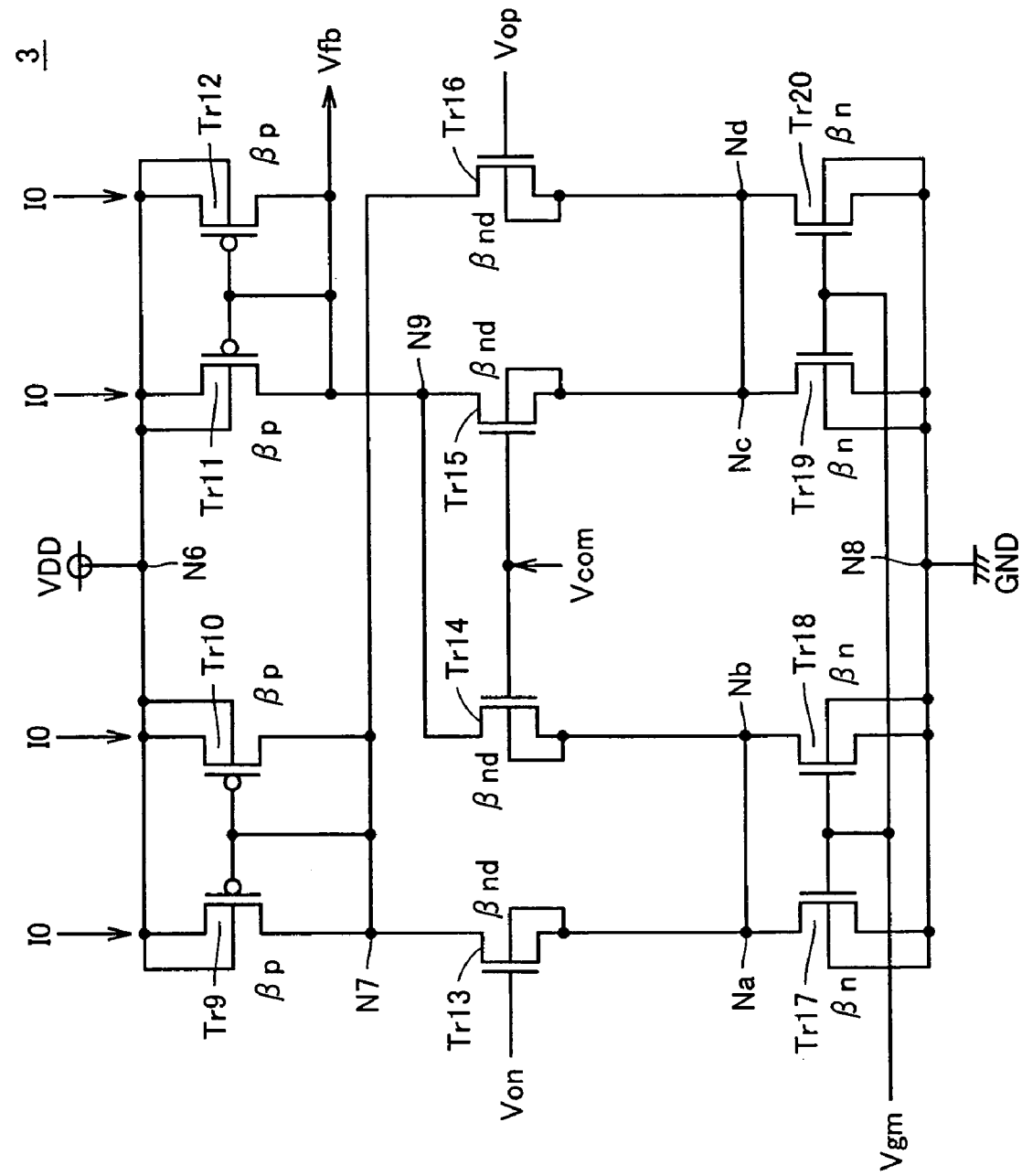
FIG. 3 shows a configuration of a common mode feedback circuit in the first embodiment.

With reference to FIG. 3, in the first embodiment common mode feedback circuit 3 includes transistors Tr9–Tr20.

Transistor Tr9 is arranged between a node N6 receiving power supply voltage VDD and a node N7 and has its gate electrically coupled with node N7. Transistor Tr10 is arranged parallel to transistor Tr9 between nodes N6 and N7 and has its gate electrically coupled with node N7. Transistor Tr11 is arranged between nodes N6 and N9 and has its gate electrically coupled with node N9. Transistor Tr12 is arranged parallel to transistor Tr11 between nodes N6 and N9 and has its gate electrically coupled with node N9. Transistor Tr13 is arranged between nodes N7 and Na and has its gate receiving differential output signal Von output from OTA circuit 2. Transistor Tr14 is arranged between nodes N9 and Nb and has its gate receiving feedback reference voltage Vcom. Transistor Tr15 is arranged between nodes N9 and Nc and has its gate receiving feedback reference voltage Vcom. Transistor Tr16 is arranged between nodes N7 and Nd and has its gate receiving differential output signal Vop.

Transistor Tr17 is arranged between node Na and a node N8 electrically coupled with ground voltage GND and has its gate receiving control signal Vgm. Transistor Tr18 is arranged between nodes Nb and N8 and has its gate receiving control signal Vgm. Transistor Tr19 is arranged between nodes Nc and N8 and has its gate receiving control signal Vgm. Transistor Tr20 is arranged between nodes Nd and N8 and has its gate receiving control signal Vgm. Furthermore, nodes Na and Nb are electrically coupled together. Nodes Nc and Nd are electrically coupled together.

Transistors Tr9–Tr12, as well as transistors Tr11 and Tr2 of OTA circuit 2, provide a β value of βp. Transistors Tr13–Tr16, as well as transistors Tr3 and Tr4 of OTA circuits 2, provide a β value of βnd. Transistors Tr17–Tr20, as well as transistors Tr7 and Tr8 of OTA circuit 2, are of βn.

Common mode feedback circuit 3 operates as will be described hereinafter.

Common mode feedback circuit 3 receives feedback reference voltage Vcom and differential output signals Von and Vop from the OTA circuit and senses them and in accordance with a result thereof generates feedback control signal Vfb. More specifically, the sum of the amounts of currents passed by differential output signals Von and Vop input is compared with an amount of current passed by feedback reference voltage Vcom and in accordance with a result thereof feedback control signal Vfp is output.

Normally, transistors Tr13 and Tr16 receive differential output signals complementary to each other and having an amplitude with feedback reference voltage Vcom serving as an intermediate voltage. Thus, the sum of the amounts of currents flowing through transistors Tr13 and Tr16 is fixed and equal to that of the amounts of currents flowing through transistors Tr14 and Tr15 having their respective gates receiving feedback reference voltage Vcom. As such the feedback control signal Vfb voltage level does not vary and feedback control signal Vfb corresponding to feedback reference voltage Vcom is fed back to OTA circuit 2. In other words, OTA circuit 2 operates in response to feedback control signal Vfb received from common mode feedback circuit 3 to generate a differential output signal with feedback reference voltage Vcom serving as amplitude's intermediate voltage.

Otherwise than normally, differential output signals Von and Vop are not complementary to each other, as normal, and signals Von and Vop can have a voltage level fixed for example at power supply voltage VDD, ground voltage GND or the like in that case, node Na and node Nb, and node Nc and node Nd are respectively, mutually electrically coupled together, and for example if signals Von and Vop have a voltage level fixed at power supply voltage VDD, node N9, close to the drain of transistor Tr14 and Tr15, has a voltage level increased. In other words, the feedback control signal Vfb voltage level increases. As the signal Vfb voltage level increases, the OTA circuit 2 transistors Tr1 and Tr2 pass a reduced current to output nodes N1 and N2, and output node N1 and node N2 have a voltage level transitioning from power supply voltage VDD toward the intermediate, feedback reference voltage Vcom voltage level. By contrast, when signals Von and Vop have a voltage level fixed at ground voltage GND, node N9, close to the drain of transistor Tr14 and Tr15, has a voltage level decreased. That is, the signal Vfb voltage level decreases. As the signal Vfb voltage level decreases, the OTA circuit 2 transistors Tr1 and Tr2 pass an increased current to output nodes N1 and N2, and output node N1 and node N2 have a voltage level transitioning from ground voltage GND toward feedback reference voltage Vcom. Thus, common mode feedback circuit 3 has a function to guarantee that an unstable state fixing output nodes N1 and N2 at power supply voltage VDD or ground voltage GND is set at a stable operation level.

Note that as will be clarified by the following description, the present invention is directed to a voltage setting circuit generating feedback reference voltage Vcom applied to common mode feedback circuit 3 to generate optimal feedback control signal Vfb as described above.

In accordance with the present invention in the first embodiment voltage setting circuit 4 generates feedback reference voltage Vcom corresponding to a voltage intermediate between maximum and minimum operating voltage values Vmax and Vmin to ensure a maximum operable range of a differential output signal of OTA circuit 2, as has been described previously.

Figure 4:
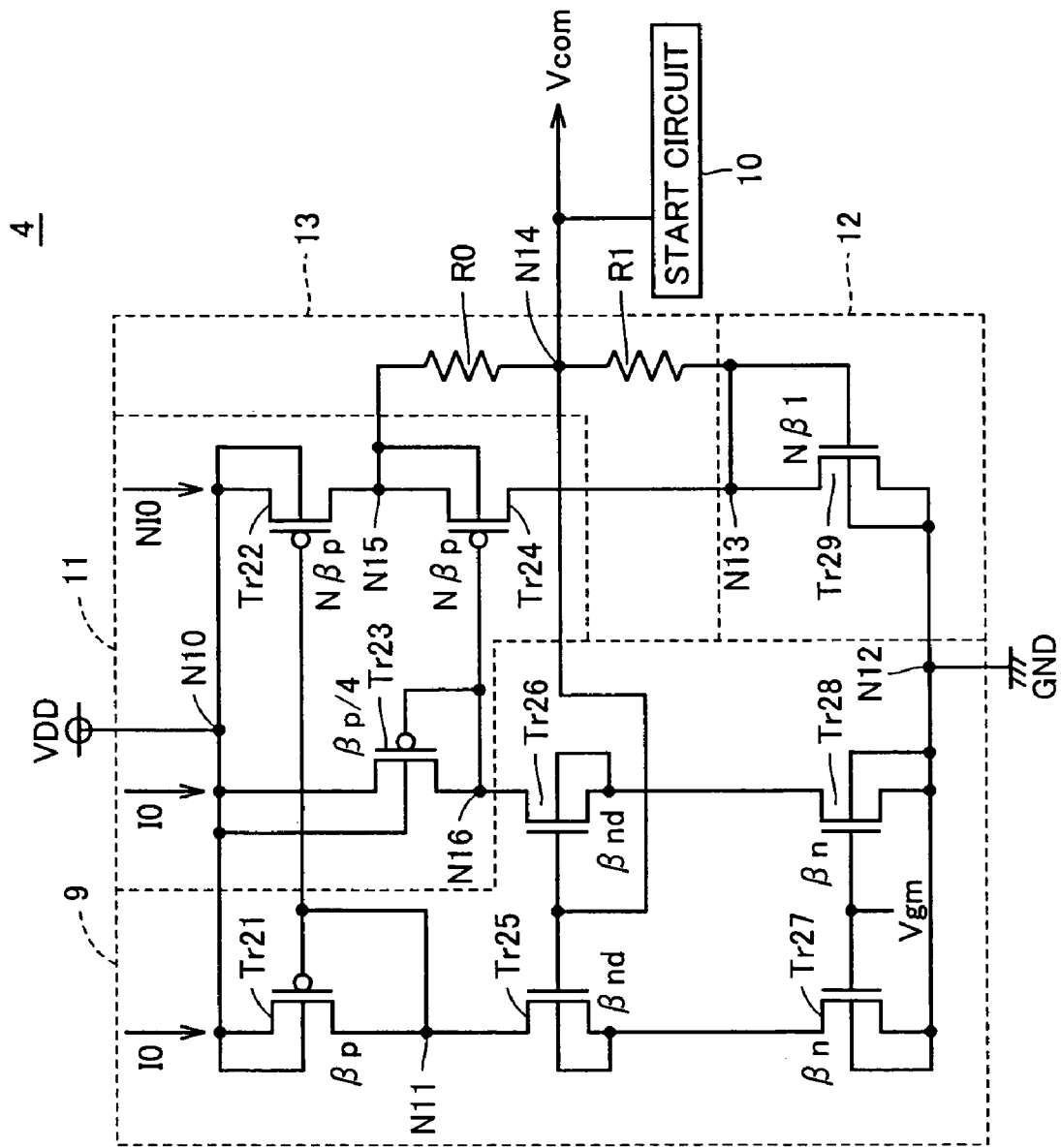
FIG. 4 shows a configuration of a voltage setting circuit in the first embodiment.

With reference to FIG. 4, the present invention in the first embodiment provides voltage setting circuit 4 including transistors Tr21–Tr29, resistors R0 and R1, and a start circuit 10.

Transistor Tr21 is arranged between a node N10 receiving power supply voltage VDD and a node N11 and has its gate electrically coupled with node N11. Transistor Tr22 is arranged between nodes N10 and N15 and have its gate electrically coupled with node N11 to cooperate with transistor Tr21 to form a current mirror circuit. Transistor Tr23 is arranged between nodes N10 and N16 and has its gate electrically coupled with node N16. Transistor Tr24 is arranged between nodes N15 and N13 and has its gate electrically coupled with node N16 to cooperate with transistor Tr23 to form a current mirror circuit. Transistors Tr25 and Tr27 are connected in series between node N11 and a node N12 receiving ground voltage GND. Transistor Tr25 has its gate electrically coupled with a node N14. Transistor Tr27 has its gate receiving control signal Vgm.

Transistors Tr26 and Tr28 are connected in series between nodes N16 and N12. Transistor Tr26 has its gate electrically coupled with node N14. Transistor Tr28 has its gate receiving control signal Vgm. Transistor Tr29 is arranged between nodes N13 and N12 and has its gate electrically coupled with node N13. Resistor R0 is arranged between nodes N15 and N14. Resistor R1 is connected between nodes N14 and N13. Start circuit 10 is electrically coupled with node N14. Voltage setting circuit 4 outputs a voltage set at node N14 to common mode feedback circuit 3 as feedback reference voltage Vcom. Note that start circuit 10 outputs feedback reference voltage Vcom to common mode feedback circuit 10 after power-on when a prescribed period of time elapses. Start circuit 10 has a function ensuring a stable operation in voltage setting circuit 4 upon activation.

Transistors Tr21–Tr24 are p channel MOS transistors and transistors Tr25–Tr29 are n channel MOS transistors for the sake of illustration.

Furthermore, for the sake of illustration, transistor Tr21 provides a β value of βp, which is identical to that of transistor Tr1 shown in FIG. 2. Transistors Tr25 and Tr26 have a β value of βnd, which is identical to that of transistors Tr3 and Tr4, as shown in FIG. 2. Transistors Tr27, TR28 have a β value of βn, which is identical to that of transistors Tr7 and Tr8, as shown in FIG. 2.

Furthermore, transistors Tr22 and Tr24 has the β value of transistor Tr1 multiplied by N, i.e., Nβp, wherein N is a natural number, and transistor Tr23 has one fourth of the β value of transistor Tr1, i.e., βp/4, for the sake of illustration.

Transistor Tr29 has a β value of Nβ1 for the sake of illustration.

Herein, transistor Tr29 has its β value set to be a constant satisfying the following equation:

$$\beta 1 = \frac{\beta n}{\left(1 + \sqrt{1-X} \sqrt{\frac{\beta n}{\beta nd}}\right)^2} \quad (0 < X < 1). \tag{3}$$

In the first embodiment voltage setting circuit 4 has transistors Tr21, T25–Tr28 similar in configuration to those of the FIG. 2 voltage setting circuit 4 and forming a replica region 9. Furthermore, transistors Tr22–Tr24 form a voltage setting region 11 setting maximum operating voltage value Vmax for node N15. Furthermore, transistor Tr29 forms a voltage setting region 12 setting minimum operating voltage value Vmin for node N13. Furthermore, resistors R0 and R1 form an intermediate voltage setting region 13 setting an intermediate voltage for node N14.

Herein, series-connected transistors Tr21, Tr25 and Tr27 form a path for a maximum current±I0 flowing through OTA circuit 2. Furthermore, series-connected transistors Tr23, Tr26, Tr28 also form a path for current±I0. Series-connected transistors Tr22, Tr24, Tr29 form a path for current±I0 multiplied by N.

Level in voltage of node N15 in voltage setting region 11 will now be considered.

The transistor Tr21 pinch-off voltage is given by the following equation:

$$Vefp^{(Tr21)} = Vgs^{(Tr21)} - Vthp = \sqrt{\frac{2I0}{\beta p}}. \tag{4}$$

Furthermore, the transistor Tr23 pinch-off voltage value is given by the following equation:

$$Vefp^{(Tr23)} = Vgs^{(Tr23)} - Vthp = 2\sqrt{\frac{2I0}{\beta p}}. \tag{5}$$

Furthermore, the transistor Tr24 pinch-off voltage value is given by the following equation:

$$Vefp^{(Tr24)} = Vgs^{(Tr24)} - Vthp = \sqrt{\frac{2I0}{\beta p}}. \tag{6}$$

Thus, the node N15 voltage value is given by the following equation:

$$V^{(N15)} = VDD - Vgs^{(Tr23)} + Vgs^{(Tr24)} \tag{7}$$

$$= VDD - \sqrt{\frac{2I0}{\beta p}}$$

$$= VDD - Vefp^{(Tr21)}.$$

Transistor Tr21 and the FIG. 2 transistor Tr1 or Tr2 are identical. Thus node N15 corresponds to maximum operating voltage value Vmax shown in FIG. 2 as have been previously described.

Level in voltage of node N13 in voltage setting region 12 will then be considered.

The transistor Tr29 pinch-off voltage value is given by the following equation:

$$Vefn^{(Tr29)} = Vgs^{(Tr29)} - Vth = \sqrt{\frac{2I0}{\beta 1}}. \tag{8}$$

Therefore, the node N13 voltage value is given by the following equation:

$$V^{(N13)} = Vthn + \sqrt{\frac{2I0}{\beta 1}}. \tag{9}$$

The β value given by expression (3), or β1, is substituted, and the node N13 voltage value is:

$$V^{(N13)} = Vthn + \left(1 + \sqrt{1-X}\sqrt{\frac{\beta n}{\beta nd}}\right)\sqrt{\frac{2I0}{\beta n}} \tag{10}$$

$$= Vthn + \sqrt{\frac{2I0}{\beta n}} + \sqrt{1-X}\sqrt{\frac{2I0}{\beta nd}}$$

$$= Vthn + Vefn + (\sqrt{1-X})Vefnd.$$

Thus node N13 can be set to a value approximate to minimum operating voltage value Vmin indicated in FIG. 2 as has been described previously.

Intermediate voltage setting region 13 sets for node N14 by resistors R0 and R1 equal in resistance an intermediate voltage level of the voltage levels set for nodes N13 and N15 that is divided in accordance with resistance. More specifically, from maximum and minimum operating voltage values Vmax and Vmin feedback reference voltage Vcom intermediate therebetween can be set and output to common mode feedback circuit 3. Resistors R0 and R1 configuring intermediate voltage setting region 13 pass a current significantly smaller than that passing through transistor Tr24 for the sake of illustration.

Thus in the first embodiment voltage setting circuit 4 can be configured so that maximum and minimum operating voltage values Vmax and Vmin defining maximum operable range Vopp in OTA circuit 2 can be set and therefrom intermediate feedback reference voltage Vcom can be set. Optimal feedback reference voltage Vcom can thus be input to common mode feedback circuit 3. In accordance with feedback reference voltage Vcom received, common mode feedback circuit 3 generates optimal feedback control signal Vfb and feeds it back to OTA circuit 2. Accordingly, OTA circuit 2 can output a differential output signal ensuring a suitable operation range with feedback reference voltage Vcom serving as amplitude's reference voltage.

Furthermore in the first embodiment voltage setting circuit 4 is configured using a transistor of the same characteristic(s) as that configuring OTA circuit 2. A such if process variation or the like causes a variation in a characteristic of a transistor a voltage level to be set can accordingly be fine adjusted. A significantly precise feedback reference voltage Vcom can thus be set.

Figure 5:
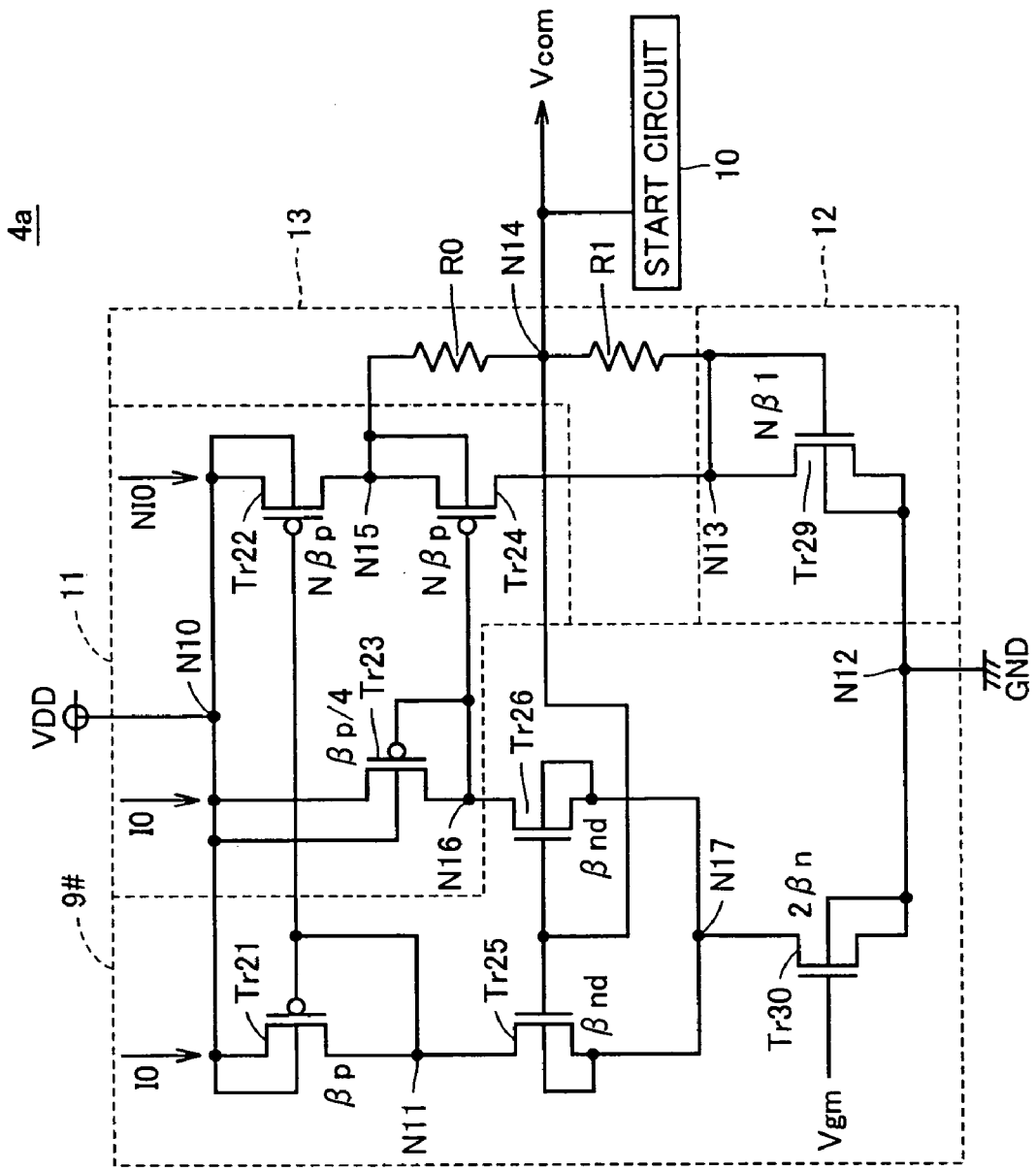
FIG. 5 shows a configuration of another voltage setting circuit in the first embodiment.

With reference to FIG. 5, the present invention in the first embodiment provides another voltage setting circuit 4a which is different from the FIG. 4 voltage setting circuit 4 in that replica region 9 is replaced with a replica replica 9#. The remainder of circuit 4a is similar to that of circuit 4 and will not be described in detail.

Replica region 9# is different from replica region 9 in that transistors Tr27 and Tr28 are common and replaced with a transistor Tr30. The remainder of region 9# is similar to that of region 9 and will not be described in detail.

Transistor Tr30 is connected between node N17, closer to the source of transistor Tr25 and Tr26, and node N12, and has its gate receiving control signal Vgm. Transistor Tr30 has a β value equal to twice that of transistor Tr27.

Accordingly in this circuit configuration, similarly as has been described previously with reference to FIG. 4, maximum operating voltage value Vmax defining maximum operable range Vopp in OTA circuit 2 is set for node N15, minimum operating voltage value Vmin is set for node N13, and feedback reference voltage Vcom intermediate as according thereto is set for node N14.

Second Embodiment

In a second embodiment will be described a configuration by way of example of another voltage setting circuit 4 b different from voltage setting circuits 4 and 4a described above in the first embodiment.

Figure 6:
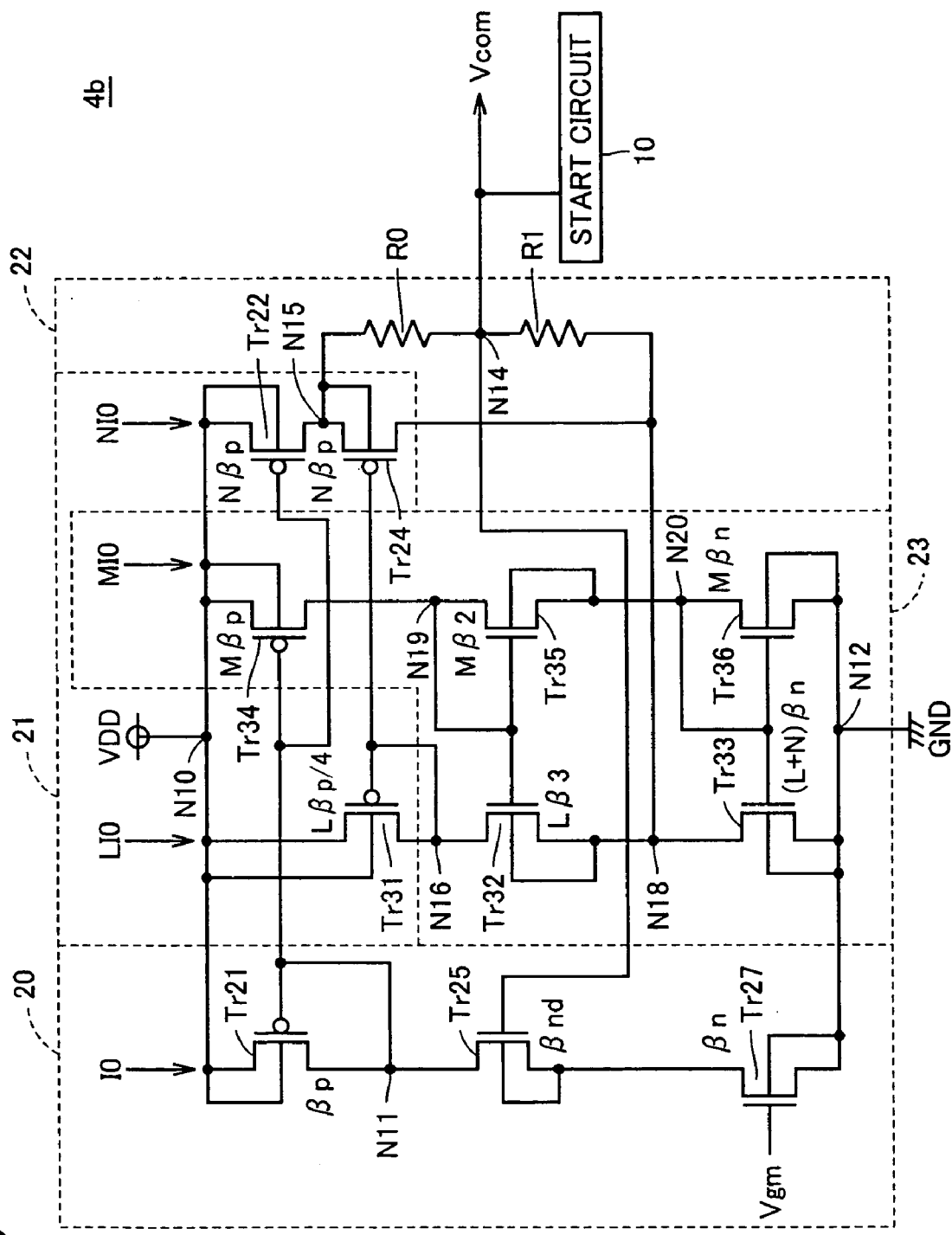
FIG. 6 shows a configuration of a voltage setting circuit in accordance with the present invention in a second embodiment.

With reference to FIG. 6, the present invention in the second embodiment provides voltage setting circuit 4b including transistors Tr21, Tr22, Tr24, Tr25, Tr27, transistors Tr31–Tr36, resistors R0, R1, and start circuit 10.

Transistors Tr21, Tr25, Tr27 are connected in series between nodes N10 and N12, similarly as has been described with reference to FIG. 4. Transistor Tr31 is arranged between nodes N10 and N16 and has its gate electrically coupled with node N16. Transistor Tr32 is arranged between nodes N16 and N18 and has its gate electrically coupled with a node N19. Transistor Tr33 is arranged between nodes N18 and N12 and has its gate electrically coupled with a node N20. Transistor Tr34 is arranged between nodes N10 and N19 and has its gate electrically coupled with node N11 to cooperate with transistor Tr21 to form a current mirror circuit. Transistor Tr35 is arranged between nodes N19 and N20 and has its gate electrically coupled with node N19 to cooperate with transistor Tr32 to form a current mirror circuit.

Transistor Tr36 is arranged between nodes N20 and N12 and has its gate electrically coupled with node N20 to cooperate with transistor Tr33 to form a current mirror circuit. Transistor Tr22 is arranged between nodes N10 and N15 and has its gate electrically coupled with node N11 to cooperate with transistor Tr21 to form a current mirror circuit. Transistor Tr24 is arranged between nodes N15 and N18 and has its gate electrically coupled with node N16 to cooperate with transistor Tr31 to form a current mirror circuit. Resistor R0 is connected between nodes N15 and N14. Resistor R1 is arranged between nodes N14 and N18. Start circuit 10 is electrically coupled with node N14. Voltage setting circuit 4b outputs a voltage set at node N14 to common mode feedback circuit 3 as feedback reference voltage Vcom.

Transistors Tr21, Tr22, Tr24, Tr31, Tr34 are p channel MOS transistors and transistors TR25, Tr27, Tr32, Tr33, Tr35, Tr36 are n channel MOS transistors for the sake of illustration.

Furthermore for the sake of illustration transistor Tr31 has a β value equal to that of transistor Tr1 multiplied by L/4, i.e., Lβp/4. Transistors Tr32 and Tr35 have β values of Lβ3 and Mβ2, respectively. Transistor Tr33 has a β value equal to that of transistors Tr7 and Tr8 multiplied by (L+N), i.e., (L+N)βn. Transistor Tr34 has a β value equal to that of transistor Tr1 multiplied by M, i.e., Mβp. Transistor Tr36 has a β value equal to that of transistors Tr7 and Tr8 multiplied by M, i.e., Mβn.

Herein, the transistors Tr32 ad Tr35 respective β values, β3 and β2, are set to be constants, respectively, satisfying the following equation:

$$\sqrt{\frac{\beta n}{\beta 2}} - \sqrt{\frac{\beta n}{\beta 3}} = \sqrt{1-X}\sqrt{\frac{\beta n}{\beta nd}}. \qquad (11)$$

In the second embodiment voltage setting circuit 4b has transistors Tr21, Tr25, Tr27 similar in configuration to those configuring the FIG. 2 OTA circuit 2, forming a replica region 20. Furthermore, transistors Tr22, Tr24, Tr31 form a voltage setting region 21 setting maximum operating voltage value Vmax for node N15. Furthermore, transistors Tr32–Tr36 form a voltage setting region 23 setting minimum operating voltage value Vmin for node N18. Furthermore, resistors R0 and R1 form an intermediate voltage setting region 22 setting an intermediate voltage for node N14.

Herein, series-connected transistors Tr21, Tr25 and Tr27 form a path for a maximum current±I0 flowing through OTA circuit 2. Furthermore, series-connected transistors Tr31 and Tr32 form a path for current±I0 multiplied by L. Furthermore, series connected transistors Tr34–Tr36 form a path for current±I0 multiplied by M. Series-connected transistors Tr22 and Tr24 form a path for current±I0 multiplied by N, wherein N is a natural number. Transistor Tr33 receives from node N18 current±I0 multiplied by (L+N).

Level in voltage of node N15 in voltage setting region 21 will now be considered.

The transistor Tr31 pinch-off voltage value is given by:

$$V_{efp}^{(Tr31)} = V_{gs}^{(Tr31)} - V_{thp} = 2\sqrt{\frac{2I0}{\beta p}}. \quad (12)$$

Furthermore, the transistor Tr24 punch-off value is given by equation (6), as has been described previously.

Therefore, the node N15 voltage value is given by:

$$V^{(N15)} = VDD - V_{gs}^{(Tr31)} + V_{gs}^{(Tr24)} \quad (13)$$
$$= VDD - \sqrt{\frac{2I0}{\beta p}}$$
$$= VDD - V_{efp}^{(Tr21)}.$$

Transistor Tr21 is identical to transistor Tr1 or Tr2 shown in FIG. 2. Thus node N15 corresponds to maximum operating voltage value Vmax as has bee described previously with reference to FIG. 2.

Level in voltage of node N18 in voltage setting region 23 will then be considered.

The transistor Tr36 pinch-off voltage value is given by:

$$V_{efn}^{(Tr36)} = V_{gs}^{(Tr36)} - V_{thn} = \sqrt{\frac{2I0}{\beta n}}. \quad (14)$$

Furthermore, the transistor Tr35 pinch-off voltage value is given by:

$$V_{efn}^{(Tr35)} = V_{gs}^{(Tr35)} - V_{thn} = \sqrt{\frac{2I0}{\beta 2}}. \quad (15)$$

Furthermore, the transistor Tr32 pinch-off voltage value is given by:

$$V_{efn}^{(Tr32)} = V_{gs}^{(Tr32)} - V_{thn} = \sqrt{\frac{2I0}{\beta 3}}. \quad (16)$$

Therefore the node N18 voltage value is given by:

$$V^{(N18)} = V_{gs}^{(Tr36)} + V_{gs}^{(Tr35)} - V_{gs}^{(Tr32)} \quad (17)$$
$$= V_{thn} + \sqrt{\frac{2I0}{\beta n}} + \sqrt{\frac{2I0}{\beta 2}} + \sqrt{\frac{2I0}{\beta 3}}$$
$$= V_{thn} + \sqrt{\frac{2I0}{\beta n}}\left(1 + \sqrt{1-X}\sqrt{\frac{\beta n}{\beta nd}}\right)$$
$$= V_{thn} + \sqrt{\frac{2I0}{\beta n}} + \sqrt{1-X}\sqrt{\frac{2I0}{\beta nd}}$$
$$= V_{thn} + V_{efn} + (\sqrt{1-X})V_{efnd}.$$

Thus node N18 can be set to a value approximate to minimum operating voltage value Vmin as has been described with reference to FIG. 2.

Intermediate voltage setting region 22 sets for node N14 by resistors R0 and R1 equal in resistance an intermediate voltage level of the voltage levels set for nodes N15 and N18 that is divided in accordance with resistance. More specifically, from maximum and minimum operating voltage values Vmax and Vmin feedback reference voltage Vcom intermediate therebetween can be set and output to common mode feedback circuit 3. Resistors R0 and R1 configuring intermediate voltage setting region 22 pass a current significantly smaller than that passing through transistor Tr24 for the sake of illustration.

Thus in the second embodiment voltage setting circuit 4b can be configured so that maximum and minimum operating voltage values Vmax and Vmin defining maximum operable range Vopp in OTA circuit 2 can be set and therefrom intermediate feedback reference voltage Vcom can be set. Optimal feedback reference voltage Vcom with process variation or the like also considered can thus be input to common mode feedback circuit 3. In accordance with feedback reference voltage Vcom received, common mode feedback circuit 3 generates optimal feedback control signal Vfb and feeds it back to OTA circuit 2. Accordingly, OTA circuit 2 can output a differential output signal ensuring a suitable operation range with feedback reference voltage Vcom serving as amplitude's reference voltage.

Third Embodiment

Figure 7:
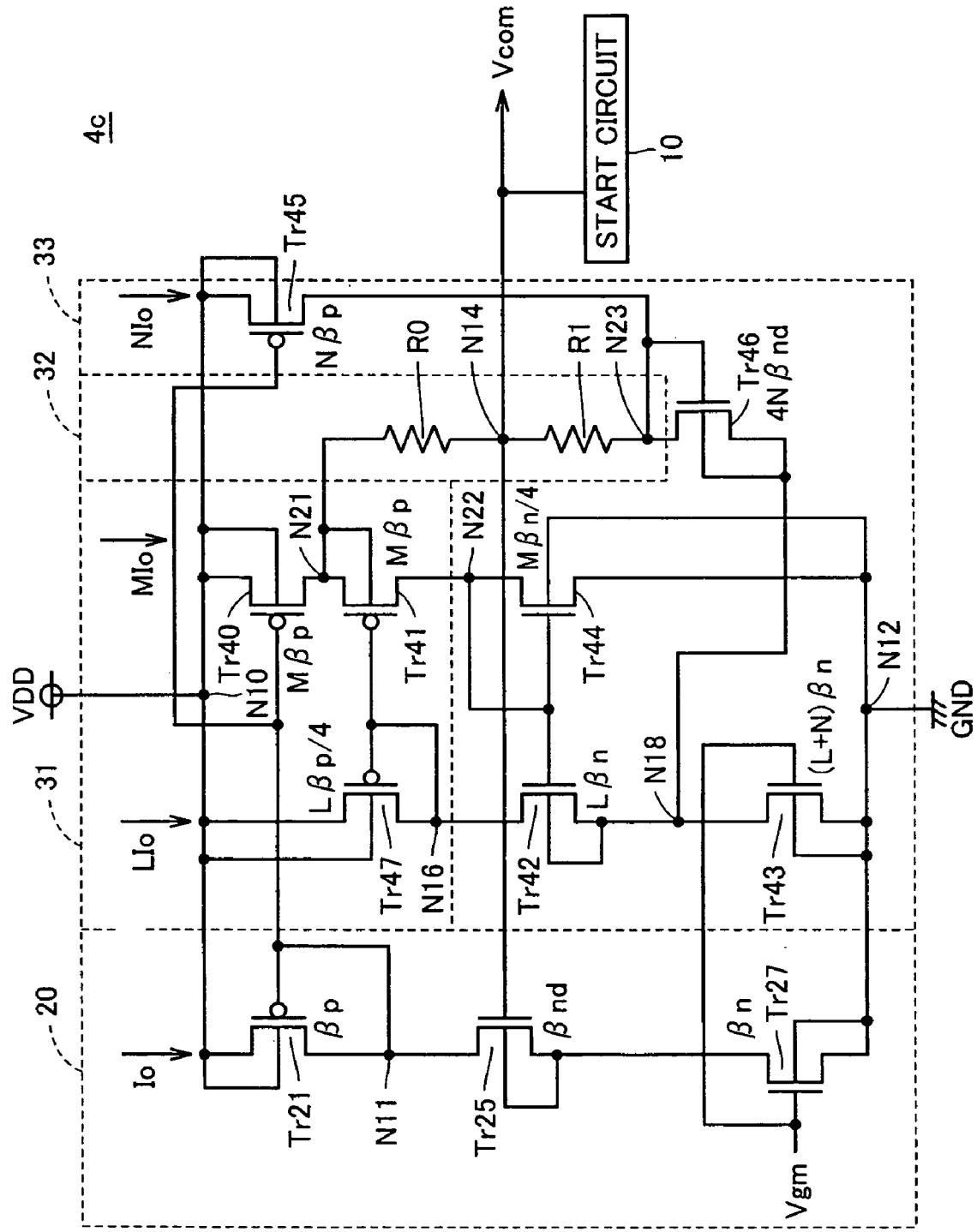
FIG. 7 shows a configuration of a voltage setting circuit in a third embodiment.

With reference to FIG. 7, the present invention in a third embodiment provides a voltage setting circuit 4c including transistors Tr21, Tr25, Tr27, transistors Tr40–Tr47, resistors R0 and R1, and start circuit 10.

Transistors Tr21, Tr25, Tr27 have a circuit configuration similarly as has been described previously and will not be described.

Transistor Tr40 is arranged between nodes N10 and N21 and has its gate electrically coupled with node N11 to cooperate with transistor Tr21 to form a current mirror circuit. Transistor Tr41 is arranged between nodes N21 and N22 and has its gate electrically coupled with node N16 to cooperate with transistor Tr47 to form a current mirror circuit. Transistor Tr47 is arranged between nodes N10 and N16 and has its gate electrically coupled with node N16. Transistor Tr42 is arranged between nodes N16 and N18 and has its gate electrically coupled with node N22. Transistor Tr43 is arranged between nodes N18 and N12 and has its gate receiving control signal Vgm. Transistor Tr44 is arranged between nodes N22 and N12 and has its gate electrically coupled with node N22 to cooperate with transistor Tr42 to form a current mirror circuit.

Transistor Tr45 is arranged between nodes N10 and N23 and has its gate electrically coupled with node N11 to cooperate with transistor Tr21 to form a current mirror circuit. Transistor Tr46 is arranged between nodes N23 and N18 and has its gate electrically coupled with node N23. Resistor R0 is connected between nodes N21 and N14. Resistor R1 is connected between nodes N14 and N23. Start circuit 10 is electrically coupled with node N14. Voltage setting circuit 4c outputs a voltage set at node N14 to common mode feedback circuit 3 as feedback reference voltage Vcom.

Transistors TR21, Tr40, Tr41, Tr45, Tr47 are p channel MOS transistors and transistors Tr25, Tr27, Tr42-Tr44, Tr46 are n channel MOS transistors for the sake of illustration.

Furthermore, for the sake of illustration, transistor Tr47 has a β value equal to that of transistor Tr1 multiplied by L/4, i.e., Lβp/4. Transistor Tr42 has a β value equal to that of transistor Tr7 and Tr8 multiplied by L, i.e., Lβn, wherein L is a natural number. Transistor Tr43 has a β value equal to that of transistor Tr7 and Tr8 multiplied by (L+N), i.e., (L+N)βn. Transistors Tr40 and Tr41 have a β value equal to that of transistor Tr1 multiplied by M, i.e., Mβp, wherein M is a natural number. Transistor Tr44 has a β value equal to that of transistors Tr7 and Tr8 multiplied by M/4, i.e., Mβn/4. Transistor Tr46 has a β value equal to that of transistors Tr3 and Tr4 multiplied by 4N, i.e., 4Nβnd. Transistor Tr45 has a β value equal to that of transistors Tr1 and Tr2 multiplied by N, i.e., Nβp.

In the third embodiment voltage setting circuit 4c has transistors Tr21, Tr25, Tr27 similar in configuration to those configuring the FIG. 2 OTA circuit 2, forming a replica region 20. Furthermore, transistors Tr40, Tr41, Tr47 form a voltage setting region 31 setting maximum operating voltage value Vmax for node N21. Furthermore, transistors Tr42–Tr44 form a voltage setting region 33 setting minimum operating voltage value Vmin for node N18. Furthermore, resistors R0 and R1 form an intermediate voltage setting region 32 setting an intermediate voltage for node N14.

Herein, series-connected transistors Tr21, Tr25 and Tr27 form a path for a maximum current±I0 flowing through OTA circuit 2. Furthermore, series-connected transistors Tr47 and Tr42 form a path for current±I0 multiplied by L. Furthermore, series connected transistors Tr40, Tr41, Tr44 form a path for current±I0 multiplied by M. Series-connected transistors Tr45 and Tr46 form a path for current±I0 multiplied by N. Transistor Tr43 receives from node N18 current±I0 multiplied by (L+N).

Level in voltage of node N21 in voltage setting circuit 31 will now be considered.

The transistor Tr47 pinch-off voltage value is given by:

$$Vefp^{(Tr47)} = Vgs^{(Tr47)} - Vthp = 2\sqrt{\frac{2I0}{\beta p}}. \quad (18)$$

Furthermore, the transistor Tr41 pinch-off voltage value is given by:

$$Vefp^{(Tr41)} = Vgs^{(Tr41)} - Vthp = \sqrt{\frac{2I0}{\beta p}}. \quad (19)$$

Therefore the node N21 voltage value is given by:

$$V^{(N21)} = VDD - Vgs^{(Tr47)} + Vgs^{(Tr41)} \quad (20)$$
$$= VDD - \sqrt{\frac{2I0}{\beta p}}$$
$$= VDD - Vefp^{(Tr21)}.$$

Transistor Tr21 is identical to transistor Tr1 or Tr2 shown in FIG. 2. Thus node N21 corresponds to maximum operating voltage value Vmax as has been described with reference to FIG. 2.

Level in voltage of node N18 in voltage setting circuit 33 will then be considered.

The transistor Tr44 pinch-off voltage value is given by:

$$Vefn^{(Tr44)} = Vgs^{(Tr44)} - Vthn = 2\sqrt{\frac{2I0}{\beta n}}. \quad (21)$$

Furthermore, the transistor Tr42 pinch-off voltage value is given by:

$$Vefn^{(Tr42)} = Vgs^{(Tr42)} - Vthn = \sqrt{\frac{2I0}{\beta n}}. \quad (22)$$

Furthermore the transistor Tr46 pinch-off voltage value is given by:

$$Vefn^{(Tr46)} = Vgs^{(Tr46)} - Vthn = \frac{1}{2}\sqrt{\frac{2I0}{\beta nd}} = \frac{1}{2}\left(\sqrt{\frac{\beta n}{\beta nd}}\sqrt{\frac{2I0}{\beta n}}\right). \quad (23)$$

Therefore the node N23 voltage value is given by:

$$V^{(N23)} = Vgs^{(Tr44)} - Vgs^{(Tr42)} + Vgs^{(Tr46)} \quad (24)$$
$$= \sqrt{\frac{2I0}{\beta n}} + \frac{1}{2}\sqrt{\frac{2I0}{\beta nd}} + Vthn$$
$$= Vefn + \frac{1}{2}\sqrt{\frac{2I0}{\beta nd}} + Vthn.$$

Thus node N23 can be set to a value approximate to minimum operating voltage value Vmin previously described with reference to FIG. 2.

Intermediate voltage setting region 32 sets for node N14 by resistors R0 and R1 equal in resistance an intermediate voltage level of the voltage levels set for nodes N21 and N23 that is divided in accordance with resistance. More specifically, from maximum and minimum operating voltage values Vmax and Vmin feedback reference voltage Vcom intermediate therebetween can be set and output to common mode feedback circuit 3. Resistors R0 and R1 configuring intermediate voltage setting region 32 pass a current significantly smaller than that passing through transistor Tr41 for the sake of illustration.

Thus in the third embodiment voltage setting circuit 4c can be configured so that maximum and minimum operating voltage values Vmax and Vmin defining maximum operable range Vopp in OTA circuit 2 can be set and therefrom intermediate feedback reference voltage Vcom can be set. Optimal feedback reference voltage Vcom with process variation or the like also considered can thus be input to common mode feedback circuit 3. In accordance with feedback reference voltage Vcom received, common mode feedback circuit 3 generates optimal feedback control signal Vfb and feeds it back to OTA circuit 2. Accordingly, OTA circuit 2 can output a differential output signal ensuring a suitable operation range with feedback reference voltage Vcom serving as amplitude's reference voltage.

Fourth Embodiment

In the present invention in a fourth embodiment will be described a configuration provided when another OTA circuit 2# having a configuration different from OTA circuit 2 is applied.

Figure 8:
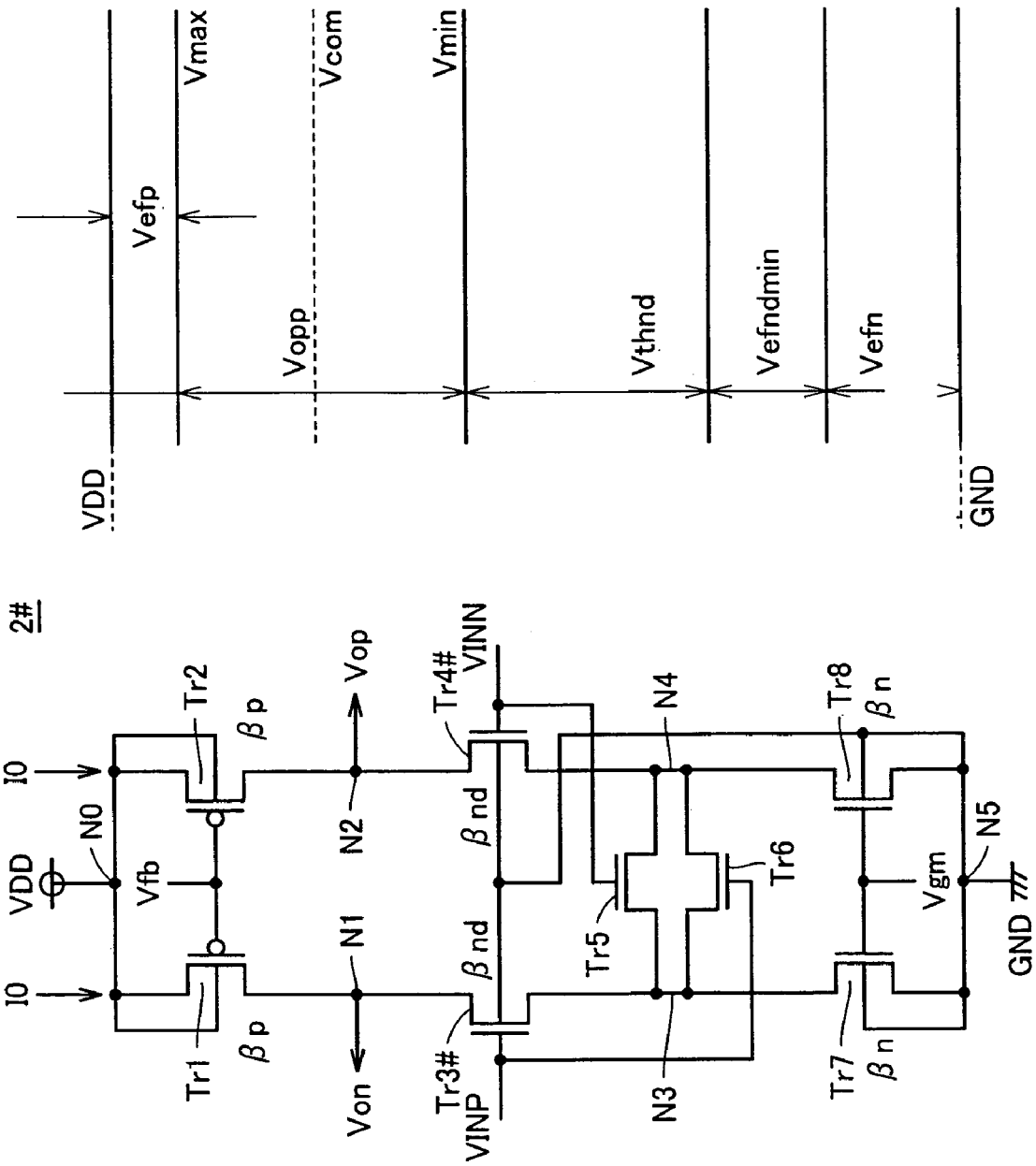
FIG. 8 shows a configuration of an OTA circuit in accordance with the present invention in a fourth embodiment.

With reference to FIG. 8, in accordance with the present invention in the fourth embodiment OTA circuit 2# is different from OTA circuit 2 described in the first embodiment in that transistors Tr3 and Tr4 are replaced with transistors Tr3# and Tr4#.

Transistors Tr3# and Tr4# have a backgate electrically coupled with node N5 receiving ground voltage GND. This arrangement allows transistors Tr3# and Tr4# to have a threshold voltage Vthnd higher than the transistors Tr3 and Tr4 threshold voltage Vthn (<Vthnd).

Figure 9:
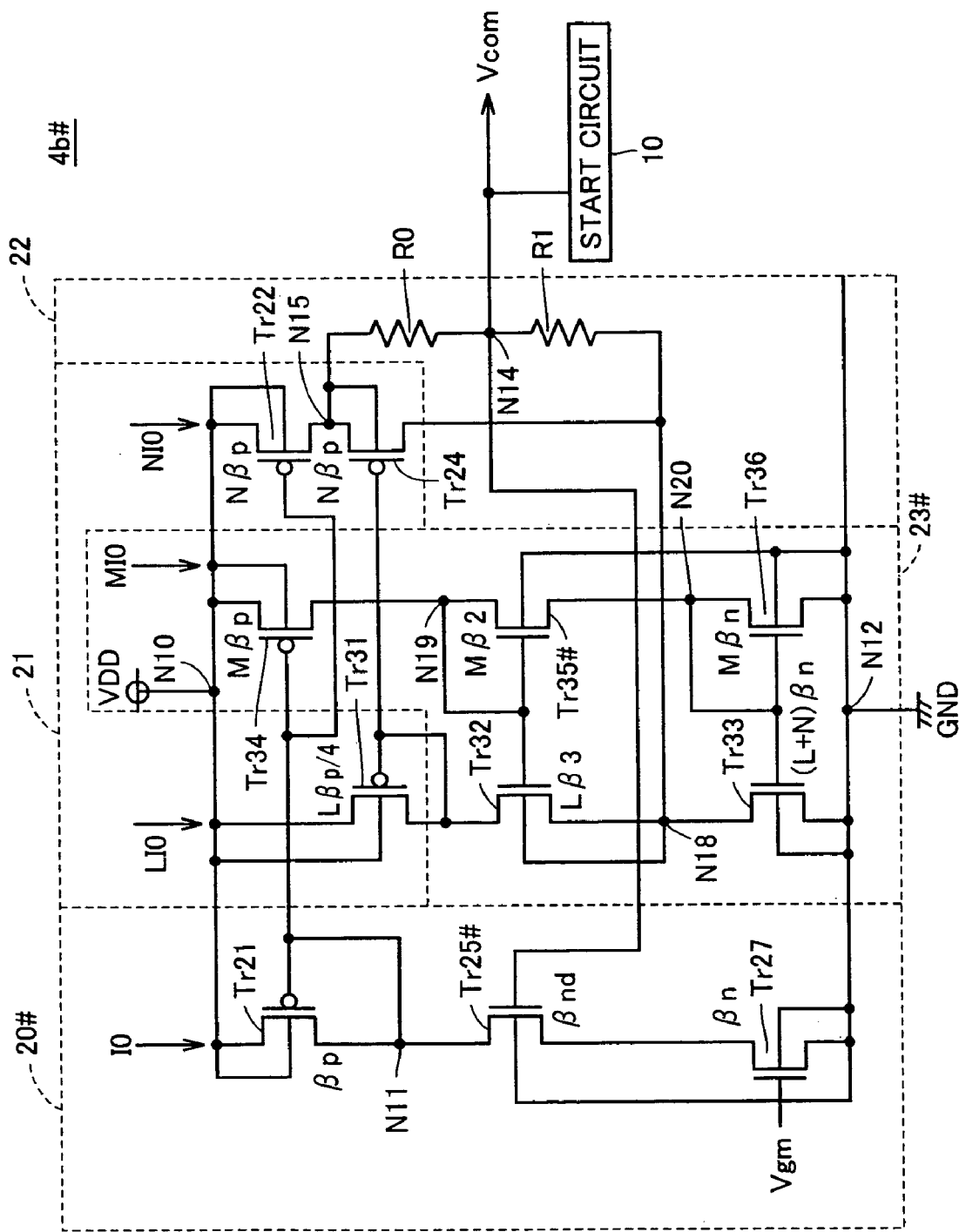
FIG. 9 shows a configuration of a voltage setting circuit designed to correspond to the OTA circuit in the fourth embodiment.

With reference to FIG. 9, the present invention in the fourth embodiment provides a voltage setting circuit 4b#, as designed to correspond to OTA circuit 2#. Voltage setting circuit 4b# is different from voltage setting circuit 4 b described in the second embodiment in that replica region 20 is replaced with a replica region 20# and that voltage setting region 23 is replaced with a voltage setting region 23#. The remainder is similar and will not be described in detail. More specifically, they are different in that transistor Tr25 is replaced with a transistor Tr25# and that transistor Tr35 is replaced with a transistor Tr35#. Transistors Tr25# and Tr35# have their respective backgates electrically coupled with node N12 receiving ground voltage GND. The remainder is similar as has been described in the second embodiment. In other words, maximum operating voltage value Vmax defining maximum operable range Vopp in OTA circuit 2# is set to a value indicated by expression (7). Furthermore, by a similar system, minimum operating voltage value Vmin is represented by:

$$V^{(N18)} = Vthnd + \sqrt{\frac{2I0}{\beta n}} + \sqrt{1-X}\sqrt{\frac{2I0}{\beta nd}} \quad (25)$$
$$= Vthnd + Vefn + \sqrt{1-X}\ Vefnd.$$

In accordance therewith intermediate feedback reference voltage Vcom can be set.

Thus intermediate feedback reference voltage Vcom that corresponds to the configuration of OTA circuit 2# can be set.

Figure 10:
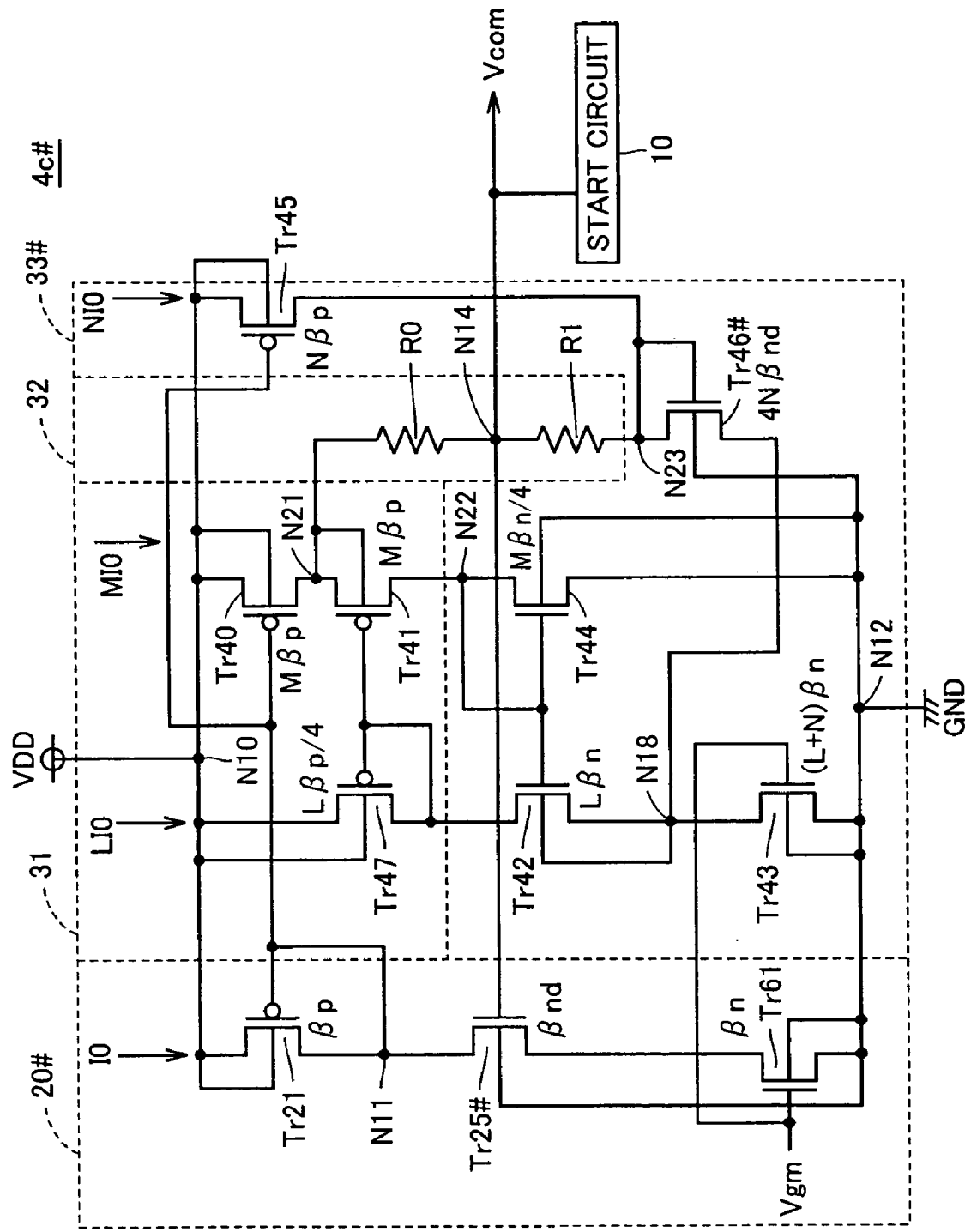
FIG. 10 shows a configuration of another voltage setting circuit designed to correspond to the OTA circuit in the fourth embodiment.

With reference to FIG. 10, the present invention in the fourth embodiment provides a voltage setting circuit 4c# designed to correspond to OTA circuit 2# in the fourth embodiment. Voltage setting circuit 4c# is different from voltage setting circuit 4c in that replica region 20 is replaced with replica region 20# and that voltage setting region 33 is replaced with voltage setting region 33#. The remainder is similar and will not be described in detail. More specifically, they are different in that transistors Tr25 and Tr46 are replaced with transistors Tr25# and Tr46#, respectively.

Transistors Tr25# and Tr46# have their respective backgates electrically coupled with node N12 receiving ground voltage GND. The remainder is similar as has been described in the third embodiment.

Accordingly, similarly as has been described above, maximum operating voltage value Vmax defining maximum operable range Vopp in OTA circuit 2# is set to a value indicated by expression (20). Furthermore, by a similar system, minimum operating voltage value Vmin is indicated by:

$$V^{(N23)} = \sqrt{\frac{2I0}{\beta n}} + \frac{1}{2}\sqrt{\frac{2I0}{\beta nd}} + Vthnd \quad (26)$$
$$= Vefn + \frac{1}{2}Vefnd + Vthnd.$$

In accordance therewith intermediate feedback reference voltage Vcom can be set.

Thus, intermediate feedback reference voltage Vcom that corresponds to the configuration of OTA circuit 2#, as has been described above, can be set.

Thus, OTA circuit 2# in accordance with the fourth embodiment can also be effective similarly as has been described in the second and third embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An operational amplifier comprising:
   an operational amplification circuit receiving two input signals and amplifying a difference in voltage between said two input signals to output two signals, respectively; and
   a feedback circuit receiving said two signals output from said differential amplification circuit to control an amount of an electric current flowing through said differential amplification circuit, said feedback circuit including
      a voltage setting circuit setting a feedback reference voltage serving as a reference in amplitude for said two signals output, and
      a common mode feedback circuit receiving said feedback reference voltage set by said voltage setting circuit and said two signals output, and driven thereby to generate a feedback control signal controlling the amount of the electric current flowing through said differential amplification circuit, said voltage setting circuit having
         a pseudo current path portion forming a current path similar to that passing through said differential amplification circuit,
         a first voltage setting portion setting as based on a current flowing through said pseudo current path portion a voltage level of a first internal node to be a first voltage corresponding to a voltage level allowing at least one of said two signals output to be maximized in amplitude,
         a second voltage setting portion setting as based on the current flowing through said pseudo current path portion a voltage level of a second internal node to be a second voltage corresponding to a voltage level allowing at least one of said two signals output to be minimized in amplitude, and
         an intermediate voltage setting portion setting for a voltage output node an average value of said first and second voltages set in said first and second voltage setting portions for said first and second internal nodes.

2. The operational amplifier of claim 1, wherein:

said differential amplification portion includes a first transistor connected between a first power supply voltage and an output node and having its gate receiving said feedback control signal, a second transistor connected via said output node to said first transistor in series and having its gate receiving one of said two input signals, and a third transistor connected between said second transistor and a second power supply voltage and having its gate receiving a prescribed voltage;

said first voltage setting portion sets said first voltage to be no more than said first power supply voltage minus a pinch-off voltage of said first transistor; and said second voltage setting portion sets said second voltage to be no less than a sum of a threshold voltage of said second transistor, a minimum value of a pinch-off voltage of said second transistor, and a pinch-off voltage of said third transistor.

3. The operational amplifier of claim 2, wherein:

said pseudo current path portion includes a first dummy transistor identical to said first transistor, connected between said first power supply voltage and a third internal node and having its gate electrically coupled with said third internal node, a second dummy transistor identical to said second transistor, connected via said third internal node to said first dummy transistor in series and having its gate coupled with said power supply output node, and a third dummy transistor identical to said third transistor, connected between said second power supply voltage and said second dummy transistor and having its gate receiving said prescribed voltage;

said first voltage setting portion has a fourth transistor connected between said first power supply voltage and said first internal node to cooperate with said first dummy transistor to form a current mirror circuit, a fifth transistor connected between said first power supply voltage and a fourth internal node and having its gate electrically coupled with said fourth internal node, and a sixth transistor connected between said first internal node and said second internal node to cooperate with said fifth transistor to form a current mirror circuit;

said fifth transistor is designed to provide a β value equal to that of said first transistor multiplied by L/4, L representing a natural number;

said fourth and sixth transistors are designed to provide a β value equal to that of said first transistor multiplied by M, M representing a natural number;

said second voltage setting portion has a seventh transistor connected between said second power supply voltage and said second internal node and having its gate electrically coupled with said second internal node; and said second transistor's pinch-off voltage is designed to be no less than a sum of said second power supply voltage, said minimum value of said pinch-off voltage of said second transistor and said pinch-off voltage of said third transistor.

4. The operational amplifier of claim 3, wherein:

said pseudo current path portion further has a fourth dummy transistor identical to said second dummy transistor, connected to said fifth transistor in series and having its gate electrically coupled with said voltage output node; and a current passing through said fourth dummy transistor flows into said third dummy transistor together with a current passing through said second dummy transistor.

5. The operational amplifier of claim 2, wherein:

said pseudo current path portion includes a first dummy transistor identical to said first transistor, connected between said first power supply voltage and a third internal node and having its gate electrically coupled with said third internal node, a second dummy transistor identical to said second transistor, connected via said third internal node to said first dummy transistor in series and having its gate coupled with said power supply output node, and a third dummy transistor identical to said third transistor, connected between said second power supply voltage and said second dummy transistor and having its gate receiving said prescribed voltage;

said first voltage setting portion has a fourth transistor connected between said first power supply voltage and said first internal node to cooperate with said first dummy transistor to form a current mirror circuit, a fifth transistor connected between said first power supply voltage and a fourth internal node and having its gate electrically coupled with said fourth internal node, and a sixth transistor connected between said first internal node and said second internal node to cooperate with said fifth transistor to form a current mirror circuit;

said fifth transistor is designed to provide a β value equal to that of said first transistor multiplied by L/4, L representing a natural number;

said fourth and sixth transistors are designed to provide a β value equal to that of said first transistor multiplied by M, M representing a natural number;

said second voltage setting portion has a seventh transistor connected between said first power supply voltage and a fifth internal node and having its gate electrically coupled with a third internal node to cooperate with said first dummy transistor to form a current mirror circuit, an eighth transistor connected to said seventh transistor in series between said fifth internal node and a sixth internal node and having its gate electrically coupled with said fifth internal node, a ninth transistor connected between said fourth and second internal nodes and having its gate electrically coupled with said fifth internal node to cooperate with said eighth transistor to form a current mirror circuit, and a tenth transistor connected between said sixth internal node and said second power supply voltage and having its gate electrically coupled with said sixth internal node; and a sum of pinch-off voltages of said eighth and tenth transistors, respectively, is designed to be no less than a sum of a pinch-off voltage of said ninth transistor, said second power supply voltage, said minimum value of said pinch-off value of said second transistor and said pinch-off voltage of said third transistor.

6. The operational amplifier of claim 5, wherein:

said differential amplification portion has said second transistor with a backgate electrically coupled with said second power supply voltage;

in said voltage setting portion said pseudo current path portion has said second dummy transistor with a backgate electrically coupled with said second power supply voltage; and said second voltage setting portion has said eighth transistor with a backgate electrically coupled with said second power supply voltage.

7. The operational amplifier of claim 2, wherein:

said pseudo current path portion includes a first dummy transistor identical to said first transistor, connected between said first power supply voltage and a third internal node and having its gate electrically coupled with said third internal node, a second dummy transistor identical to said second transistor, connected via said third internal node to said first dummy transistor in series and having its gate coupled with said power supply output node, and a third dummy transistor identical to said third transistor, connected between said second power supply voltage and said second dummy transistor and having its gate receiving said prescribed voltage;

said first voltage setting portion has a fourth transistor connected between said first power supply voltage and said first internal node to cooperate with said first dummy transistor to form a current mirror circuit, a fifth transistor connected between said first power supply voltage and a fourth internal node and having its gate electrically coupled with said fourth internal node, and a sixth transistor connected between said first internal node and said second internal node to cooperate with said fifth transistor to form a current mirror circuit;

said fifth transistor is designed to provide a β value equal to that of said first transistor multiplied by L/4, L representing a natural number;

said fourth and sixth transistors are designed to provide a β value equal to that of said first transistor multiplied by M, M representing a natural number;

said second voltage setting portion has a seventh transistor connected between said fifth internal node and said second power supply voltage and having its gate electrically coupled with said fifth internal node, an eighth transistor connected between said fourth internal node and a sixth internal node to cooperate with said seventh transistor to form a current mirror circuit, a ninth transistor connected between said sixth and second internal nodes and having its gate electrically coupled with said second internal node, and a tenth transistor connected between said first power supply voltage and said second internal node and having its gate electrically coupled with said third internal node to cooperate with said first dummy transistor to form a current mirror circuit;

said seventh transistor is designed to provide a β value equal to that of said third transistor multiplied by M/4;

said eighth transistor is designed to provide a β value equal to that of said third transistor multiplied by L; and said ninth transistor is designed to provide a β value equal to that of said second transistor multiplied as prescribed.

8. The operational amplifier of claim 7, wherein:

said differential amplification portion has said second transistor with a backgate electrically coupled with said second power supply voltage;

in said voltage setting portion said pseudo current path portion has said second dummy transistor with a backgate electrically coupled with said second power supply voltage; and said second voltage setting portion has said ninth transistor with a backgate electrically coupled with said second power supply voltage.

9. The operational amplifier of claim 1, wherein said voltage setting circuit further includes a start circuit outputting said feedback reference voltage from said voltage output node to said common mode feedback circuit after power-on when a prescribed period of time elapses.

* * * * *